US012321009B1

(12) United States Patent
Aboketaf et al.

(10) Patent No.: US 12,321,009 B1
(45) Date of Patent: Jun. 3, 2025

(54) PHOTODETECTORS WITH MULTIPLE LIGHT-ABSORBING SEMICONDUCTOR LAYERS

(71) Applicant: GlobalFoundries U.S. Inc., Malta, NY (US)

(72) Inventors: Abdelsalam Aboketaf, Essex Junction, VT (US); Yusheng Bian, Ballston Lake, NY (US); Won Suk Lee, Malta, NY (US)

(73) Assignee: GlobalFoundries U.S. Inc., Malta, NY (US)

( * ) Notice: Subject to any disclaimer, the term of this patent is extended or adjusted under 35 U.S.C. 154(b) by 0 days.

(21) Appl. No.: 18/806,772

(22) Filed: Aug. 16, 2024

(51) Int. Cl.
*H10F 30/223* (2025.01)
*G02B 6/12* (2006.01)
*H10F 71/00* (2025.01)
*H10F 77/122* (2025.01)
*H10F 77/40* (2025.01)

(52) U.S. Cl.
CPC ....... *G02B 6/12004* (2013.01); *H10F 30/223* (2025.01); *H10F 71/1212* (2025.01); *H10F 77/122* (2025.01); *H10F 77/413* (2025.01)

(58) Field of Classification Search
CPC ............ H01L 31/02327; H01L 31/028; H01L 31/105; H01L 31/1808; G02B 6/12004; H10F 77/413; H10F 77/122; H10F 30/223; H10F 71/1212
See application file for complete search history.

(56) References Cited

U.S. PATENT DOCUMENTS

| | | | | |
|---|---|---|---|---|
| 11,520,113 B1 * | 12/2022 | Aboketaf | ............. | G02B 6/4204 |
| 2022/0146751 A1 * | 5/2022 | Bian | ................ | G02B 6/12014 |
| 2022/0350079 A1 * | 11/2022 | Aboketaf | ............... | G02B 6/131 |
| 2024/0142725 A1 * | 5/2024 | Bian | ................... | G02B 6/1228 |

FOREIGN PATENT DOCUMENTS

CN      116825875 A   *   9/2023

OTHER PUBLICATIONS

English translation CN 116825875A: Wang et al. Microwave Photon Detector Integrated on Chip and Detection Method Thereof, Sep. 29, 2023, pp. 1-20 (Year: 2023).*
Li, D. et al.; "High-Speed and High-Power Ge-on-Si Photodetector with Bilateral Mode-Evolution-Based Coupler." Photonics 2023, 10, 142. https://doi.org/10.3390/photonics 10020142.

(Continued)

*Primary Examiner* — Shaun M Campbell
(74) *Attorney, Agent, or Firm* — Thompson Hine LLP; Anthony Canale

(57) ABSTRACT

Structures for a photonic chip that include a photodetector and methods of forming such structures. The structure comprises a photodetector including a pad, a first semiconductor layer on the pad, and a second semiconductor layer on the pad. The second semiconductor layer is laterally spaced from the first semiconductor layer. The structure further comprises a first waveguide core connected to the pad adjacent to the first semiconductor layer, and a second waveguide core connected to the pad adjacent to the second semiconductor layer.

20 Claims, 6 Drawing Sheets

(56) References Cited

OTHER PUBLICATIONS

K. Giewont et al., "300-mm Monolithic Silicon Photonics Foundry Technology," in IEEE Journal of Selected Topics in Quantum Electronics, vol. 25, No. 5, pp. 1-11, Sep.-Oct. 2019, Art No. 8200611, doi: 10.1109/JSTQE.2019.2908790.
Y. Bian et al., "3D Integrated Laser Attach Technology on 300-mm Monolithic Silicon Photonics Platform," 2020 IEEE Photonics Conference (IPC), 2020, pp. 1-2, doi: 10.1109/IPC47351.2020. 9252280.
B. Peng et al., "A CMOS Compatible Monolithic Fiber Attach Solution with Reliable Performance and Self-alignment," in Optical Fiber Communication Conference (OFC) 2020, OSA Technical Digest (Optica Publishing Group, 2020), paper Th3I.4.
Y. Bian et al., "Towards low-loss monolithic silicon and nitride photonic building blocks in state-of-the-art 300mm CMOS foundry," in Frontiers in Optics / Laser Science, B. Lee, C. Mazzali, K. Corwin, and R. Jason Jones, eds., OSA Technical Digest (Optica Publishing Group, 2020), paper FW5D.2.
M. Rakowski et al., "45nm CMOS—Silicon Photonics Monolithic Technology (45CLO) for next-generation, low power and high speed optical interconnects," in Optical Fiber Communication Conference (OFC) 2020, OSA Technical Digest (Optica Publishing Group, 2020), paper T3H.3.
Y. Bian et al., "Hybrid III-V laser integration on a monolithic silicon photonic platform," in Optical Fiber Communication Conference (OFC) 2021, P. Dong, J. Kani, C. Xie, R. Casellas, C. Cole, and M. Li, eds., OSA Technical Digest (Optica Publishing Group, 2021), paper M5A.2.
Y. Bian et al., "Monolithically integrated silicon nitride platform," in Optical Fiber Communication Conference (OFC) 2021, P. Dong, J. Kani, C. Xie, R. Casellas, C. Cole, and M. Li, eds., OSA Technical Digest (Optica Publishing Group, 2021), paper Th1A.46.

Y. Bian et al., "Monolithically integrated self-aligned SiN edge coupler with <0.6/0.8 dB TE/TM insertion loss, <−39 dB back reflection and >520 mW high-power handling capability," in Optical Fiber Communication Conference (OFC) 2023, Technical Digest Series (Optica Publishing Group, 2023), paper M3C.3.
Y. Bian et al., "Polarization mode dispersion in CMOS-integrated monolithic SiPh components: simulations and experiments," 2023 Optical Fiber Communications Conference and Exhibition (OFC), San Diego, CA, USA, 2023, pp. 1-3, doi: 10.1364/OFC.2023. Th2A.24.
A. Aboketaf et al., "Towards fully automated testing and characterization for photonic compact modeling on 300-mm wafer platform," in Optical Fiber Communication Conference (OFC) 2021, P. Dong, J. Kani, C. Xie, R. Casellas, C. Cole, and M. Li, eds., OSA Technical Digest (Optica Publishing Group, 2021), paper W6A. 1.
Y. Bian et al., "3D Integrated Laser Attach Technology on a 300-mm Monolithic CMOS Silicon Photonics Platform," in IEEE Journal of Selected Topics in Quantum Electronics, vol. 29, No. 3: Photon. Elec. Co-Inte. and Adv. Trans. Print., pp. 1-19, May-Jun. 2023, Art No. 8200519, doi: 10.1109/JSTQE.2023.3238290.
Y. Bian et al., "Towards polarization insensitive photonic integrated circuits: polarization dependent loss reduction of CMOSintegrated monolithic SiPh components." OFC 2024, Optica Publishing Group 2024; pp. 1-3; M1J.4.
Won Suk Lee et al., "Low-loss and broadband adiabatic polarization splitter rotator on a CMOS-integrated silicon photonics platform." OFC 2024, Optica Publishing Group 2024; pp. 1-3; M1J.5.
Y. Bian et al., "Mitigating substrate leakage loss on a monolithic SiPh platform: experimental demonstration of hybrid Si—SiN waveguides for O-band datacom." OFC 2024, Optica Publishing Group 2024; pp. 1-3; Th3H.3.
Sujith Chandran et al., "High Performance Silicon Nitride Passive Optical Components on Monolithic Silicon Photonics Platform." OFC 2024, Optica Publishing Group 2024; pp. 1-3; Th3H.4.

\* cited by examiner

PHOTODETECTORS WITH MULTIPLE LIGHT-ABSORBING SEMICONDUCTOR LAYERS

BACKGROUND

The disclosure relates to photonic chips and, more specifically, to structures for a photonic chip that include a photodetector and methods of forming such structures.

Photonic chips are used in many applications and systems including, but not limited to, data communication systems and data computation systems. A photonic chip includes a photonic integrated circuit comprised of photonic components, such as modulators, polarizers, and optical couplers, that are used to manipulate light received from a light source, such as an optical fiber or a laser. A photodetector may be employed in the photonic integrated circuit to convert light, which may be modulated as an optical signal, into an electrical signal. The responsivity of a photodetector is a measure of the optical-to-electrical conversion efficiency. The bandwidth of a photodetector is a measure of the speed at which the photodetector responds to variations in the incident optical power. At input optical powers greater than around one milliwatt, the performance of a photodetector may be degraded at normal operating voltages. For example, the bandwidth and the responsivity of a photodetector may represent performance parameters that are degraded in response to a high input optical power.

Improved structures for a photonic chip that include a photodetector and methods of forming such structures are needed.

SUMMARY

In an embodiment of the invention, a structure for a photonic chip is provided. The structure comprises a photodetector including a pad, a first semiconductor layer on the pad, and a second semiconductor layer on the pad. The second semiconductor layer is laterally spaced from the first semiconductor layer. The structure further comprises a first waveguide core connected to the pad adjacent to the first semiconductor layer, and a second waveguide core connected to the pad adjacent to the second semiconductor layer.

In an embodiment of the invention, a method of forming a structure for a photonic chip is provided. The method comprises forming a photodetector including a pad, a first semiconductor layer on the pad, and a second semiconductor layer on the pad. The second semiconductor layer is laterally spaced from the first semiconductor layer. The method further comprises forming a first waveguide core connected to the pad adjacent to the first semiconductor layer and forming a second waveguide core connected to the pad adjacent to the second semiconductor layer.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
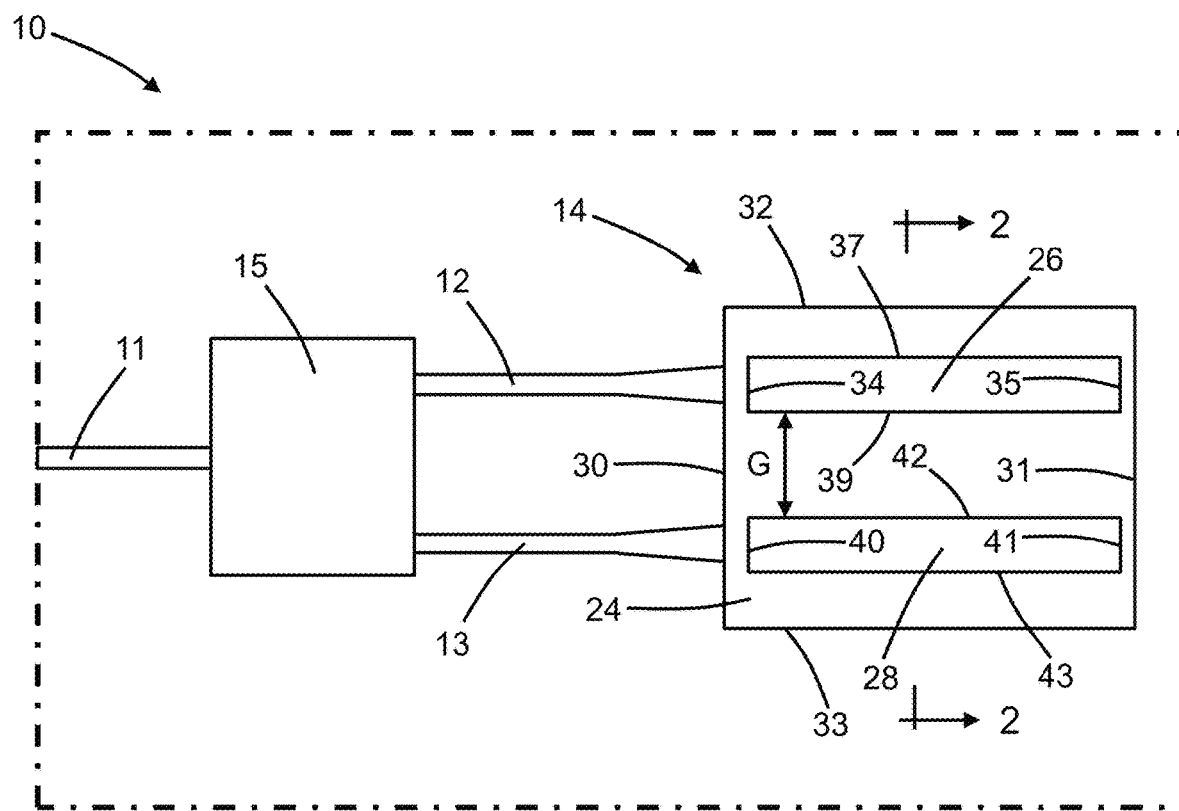
FIG. 1 is a top view of a structure at an initial fabrication stage of a processing method in accordance with embodiments of the invention.
Figure 2:
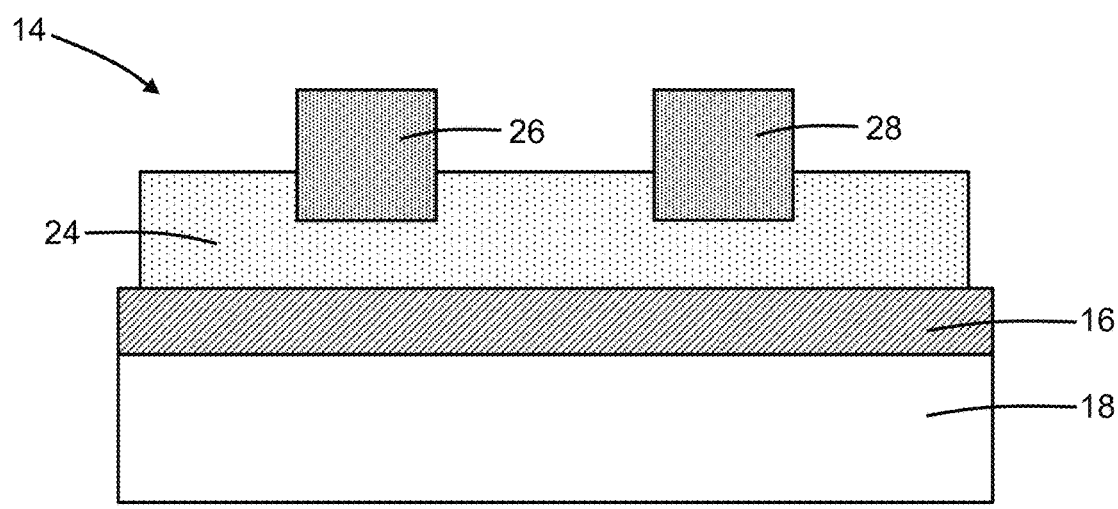
FIG. 2 is a cross-sectional view taken generally along line 2-2 in FIG. 1.

With reference to FIGS. 1, 2 and in accordance with embodiments of the invention, a structure 10 includes a waveguide core 11, a waveguide core 12, a waveguide core 13, a photodetector 14, and a multimode interference coupler 15 that are positioned on, and above, a dielectric layer 16 and a semiconductor substrate 18. In an embodiment, the dielectric layer 16 may be comprised of a dielectric material, such as silicon dioxide, and the semiconductor substrate 18 may be comprised of a semiconductor material, such as single-crystal silicon. In an embodiment, the dielectric layer 16 may be a buried oxide layer of a silicon-on-insulator substrate, and the dielectric layer 16 may provide low-index cladding.

The photodetector 14 includes a pad 24 having a side edge 30, a side edge 31 opposite from the side edge 30, a side edge 32, and a side edge 33 opposite from the side edge 32. The side edges 30, 31, 32, 33 may surround an outer perimeter of the pad 24, and the side edges 30, 31, 32, 33 may extend from a top surface of the pad 24 to a top surface of the dielectric layer 16. The photodetector 14 further includes a semiconductor layer 26 and a semiconductor layer 28 providing light-absorbing layers that are disposed on the pad 24 with an inward spacing from the outer perimeter of the pad 24.

The semiconductor layer 26 may have a sidewall 34 that is positioned adjacent to the side edge 30 of the pad 24, a sidewall 35 that is positioned adjacent to the side edge 31 of the pad 24, a sidewall 37 that is positioned adjacent to the side edge 32 of the pad 24, and a sidewall 39 that is positioned adjacent to the semiconductor layer 28. The semiconductor layer 26 extends lengthwise on the pad 24 from the sidewall 34 to the sidewall 35. A portion of the pad 24 is laterally positioned between the sidewall 37 of the semiconductor layer 26 and the side edge 32 of the pad 24.

The semiconductor layer 28 may have a sidewall 40 that is positioned adjacent to the side edge 30 of the pad 24, a sidewall 41 that is positioned adjacent to the side edge 31 of the pad 24, a sidewall 42 that is positioned adjacent to the semiconductor layer 26, and a sidewall 43 that is positioned adjacent to the side edge 33 of the pad 24. The sidewall 42 of the semiconductor layer 28 is spaced from the sidewall 39 of the semiconductor layer 26 by a gap G. The semiconductor layer 28 extends lengthwise on the pad 24 from the sidewall 40 to the sidewall 41. A portion of the pad 24 is laterally positioned between the sidewall 43 of the semiconductor layer 28 and the side edge 33 of the pad 24. A portion of the pad 24 is laterally positioned between the sidewall 39 of the semiconductor layer 26 and the sidewall 42 of the semiconductor layer 28.

The waveguide core 12 adjoins (i.e., shares a boundary with) a portion of the side edge 30 of the pad 24 adjacent to the sidewall 34 of the semiconductor layer 26 in a butt-coupled arrangement. The waveguide core 13 adjoins a portion of the side edge 30 of the pad 24 adjacent to the sidewall 40 of the semiconductor layer 28 in a butt-coupled arrangement. In an embodiment, the waveguide core 12 and the waveguide core 13 may have tapered sections that adjoin the side edge 30 of the pad 24.

The waveguide core 11 is coupled to an input of the multimode interference coupler 15. The waveguide cores 12, 13 are coupled to respective outputs from the multimode interference coupler 15 such that each receives a portion of the optical power that is split by the multimode interference coupler 15 according to a splitting ratio. For example, the multimode interference coupler 15 may evenly split optical power between the outputs such that half of the optical power is directed to each of the waveguide cores 12, 13.

In an embodiment, the waveguide cores 11, 12, 13, the multimode interference coupler 15, and the pad 24 may be comprised of a material having a refractive index that is greater than the refractive index of silicon dioxide. In an embodiment, the waveguide cores 11, 12, 13, the multimode interference coupler 15, and the pad 24 may be comprised of a semiconductor material. In an embodiment, the waveguide cores 11, 12, 13, the multimode interference coupler 15, and the pad 24 may be comprised of single-crystal silicon. The waveguide cores 11, 12, 13, the multimode interference coupler 15, and the pad 24 of the photodetector 14 may be formed by patterning a layer comprised of their constituent material with lithography and etching processes. In an embodiment, the waveguide cores 11, 12, 13, the multimode interference coupler 15, and the pad 24 of the photodetector 14 may be formed by patterning the semiconductor material (e.g., single-crystal silicon) of a device layer of a silicon-on-insulator substrate.

The semiconductor layers 26, 28 of the photodetector 14 may be comprised of a light-absorbing semiconductor material that can generate charge carriers from photons of absorbed light by photoelectric conversion. In an embodiment, the semiconductor layers 26, 28 may be formed by an epitaxial growth process. In an embodiment, the semiconductor layers 26, 28 may be epitaxially grown inside trenches that are patterned in the pad 24 such that the semiconductor layers 26, 28 each include a lower portion disposed below a top surface of the pad 24 and an upper portion disposed above the top surface of the pad 24. A hardmask comprised of a dielectric material may be disposed on the top surface of the pad 24 and may surround the trenches during the epitaxial growth process, and then may be removed following the epitaxial growth process. In an alternative embodiment, the semiconductor layers 26, 28 of the photodetector 14 may be formed on the top surface of the pad 24.

The semiconductor layers 26, 28 are comprised of a light-absorbing material that is capable of photoelectric conversion. In an embodiment, the semiconductor layers 26, 28 may be comprised of an intrinsic semiconductor material. In an embodiment, the semiconductor layers 26, 28 may be comprised of intrinsic germanium. In an embodiment, the semiconductor layers 26, 28 may be comprised of intrinsic silicon-germanium. In an alternative embodiment, the semiconductor layers 26, 28 may be comprised of a different type of semiconductor material, such as a III-V compound semiconductor material or intrinsic silicon.

Figure 3:
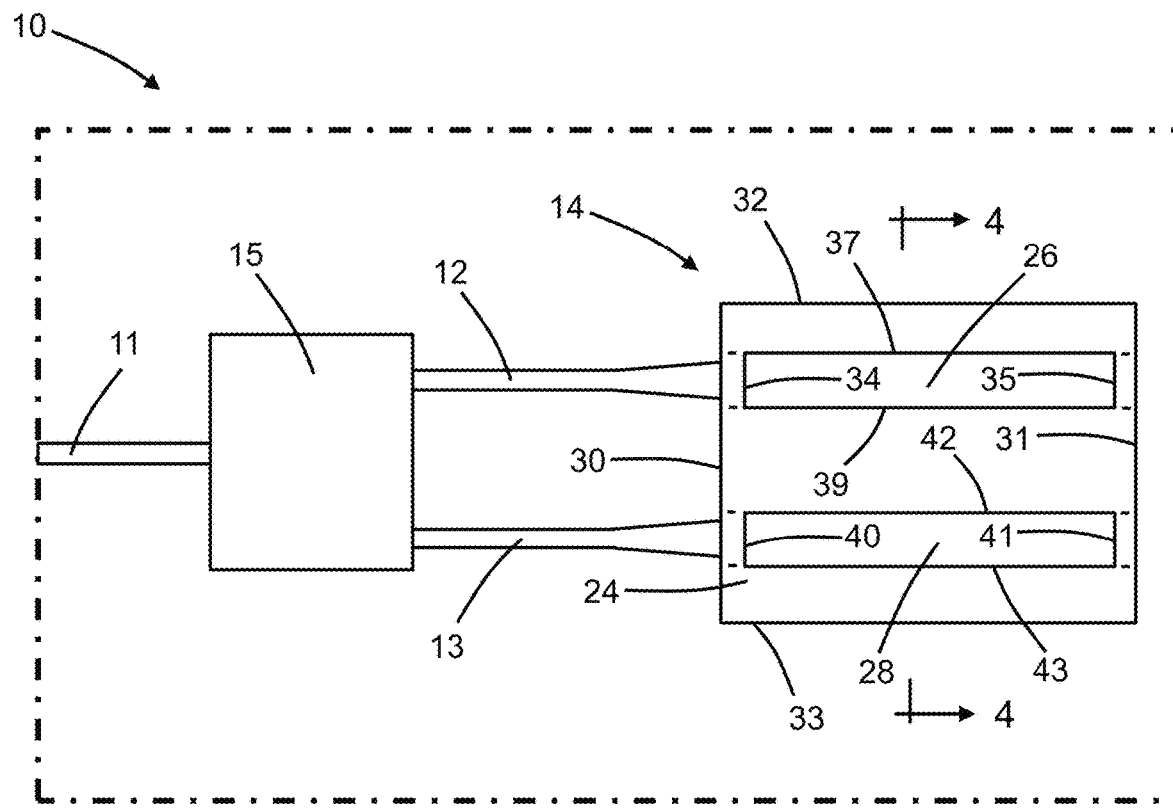
FIG. 3 is a top view of the structure at a fabrication stage of the processing method subsequent to FIGS. 1, 2.
Figure 4:
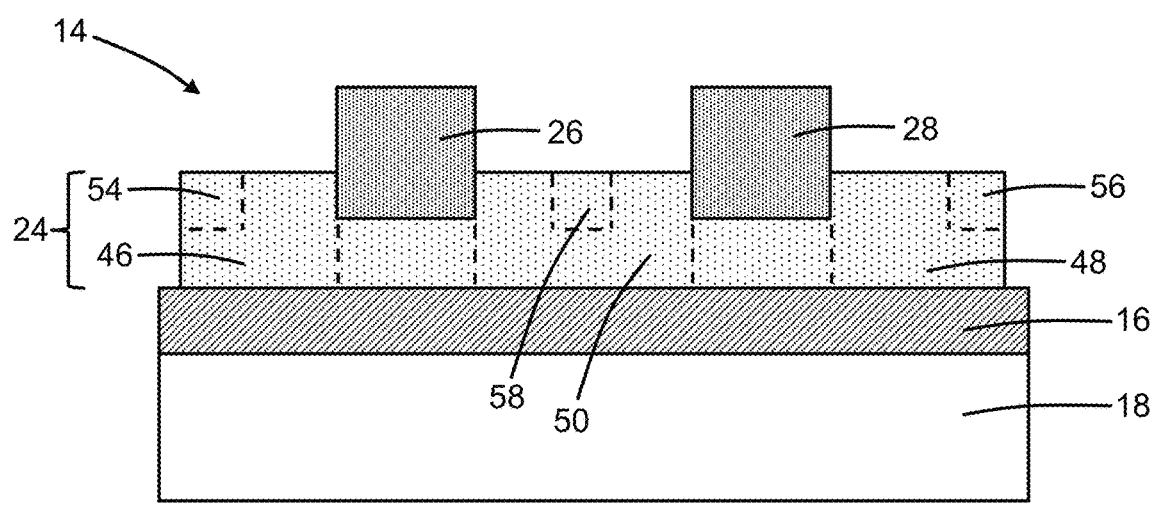
FIG. 4 is a cross-sectional view taken generally along line 4-4 in FIG. 3.

With reference to FIGS. 3, 4 in which like reference numerals refer to like features in FIGS. 1, 2 and at a subsequent fabrication stage, the structure 10 may include a doped region 46 that is formed in a peripheral portion of the pad 24 adjacent to the sidewall 37 of the semiconductor layer 26 and a doped region 48 that is formed in a peripheral portion of the pad 24 adjacent to the sidewall 43 of the semiconductor layer 28. The structure 10 may include a doped region 50 that is formed in a central portion of the pad 24 between the sidewall 39 of the semiconductor layer 26 and the sidewall 42 of the semiconductor layer 28. The doped regions 46, 48 differ in conductivity type from the doped region 50. The semiconductor layer 26 is laterally positioned on the pad 24 between the doped region 46 and the doped region 50, and the semiconductor layer 28 is laterally positioned on the pad 24 between the doped region 48 and the doped region 50. The doped regions 46, 48 and the doped region 50 may extend fully through the entire thickness of the pad 24 to the underlying dielectric layer 16. In an embodiment, the doped regions 46, 48 may define an anode of the photodetector 14 and the doped region 50 may define a cathode of the photodetector 14. In an alternative embodiment, the doped regions 46, 48 may define a cathode of the photodetector 14 and the doped region 50 may define an anode of the photodetector 14.

The doped regions 46, 48 may be formed by, for example, ion implantation with an implantation mask having openings that determine the implanted areas of the pad 24. The implantation mask may include a layer of photoresist applied by a spin-coating process, pre-baked, exposed to light projected through a photomask, baked after exposure, and developed with a chemical developer to define the openings over the areas of the pad 24 to be implanted. The implantation conditions, such as ion species, dose, and kinetic energy, may be selected to tune the electrical and physical characteristics of the doped regions 46, 48. The implantation mask may be stripped after forming the doped regions 46, 48. In an embodiment, the semiconductor material of the doped regions 46, 48 may contain a p-type dopant, such as boron, that provides p-type electrical conductivity. In an alternative embodiment, the semiconductor material of the doped regions 46, 48 may contain an n-type dopant, such as phosphorus or arsenic, that provides n-type electrical conductivity. In an alternative embodiment, portions of the semiconductor layers 26, 28 immediately adjacent to the doped regions 46, 48 may also be implanted due to partial overlap of the openings in the implantation mask with the semiconductor layers 26, 28.

The doped region 50 may be formed by, for example, ion implantation with an implantation mask having an opening that determines an implanted area of the pad 24. The implantation mask may include a layer of photoresist applied by a spin-coating process, pre-baked, exposed to light projected through a photomask, baked after exposure, and developed with a chemical developer to define the opening over the area of the pad 24 to be implanted. The implantation conditions, such as ion species, dose, and kinetic energy, may be selected to tune the electrical and physical characteristics of the doped region 50. The implantation mask may be stripped after forming the doped region 50. In an embodiment, the semiconductor material of the doped region 50 may contain an n-type dopant, such as phosphorus or arsenic, that provides n-type electrical conductivity if the doped regions 46, 48 contain a p-type dopant. In an alternative embodiment, the semiconductor material of the doped region 50 may contain a p-type dopant, such as boron, that provides p-type electrical conductivity if the doped regions 46, 48 contain an n-type dopant. In an alternative embodiment, portions of the semiconductor layers 26, 28 immediately adjacent to the doped region 50 may also be implanted due to partial overlap of the openings in the implantation mask with the semiconductor layers 26, 28.

A portion of the pad 24 beneath the semiconductor layer 26 and a portion of the pad 24 beneath the semiconductor layer 28 may be comprised of intrinsic semiconductor material, such as intrinsic silicon, that is not doped by the ion implantation forming the doped regions 46, 48 and the ion implantation forming doped region 50. In an embodiment, the intrinsic portions of the pad 24 may extend beneath the semiconductor layers 26, 28 from the side edge 30 of the pad 24 to the side edge 31 of the pad 24. The doped region 46, the intrinsic semiconductor materials of the semiconductor layer 26 and the portion of the pad 24 beneath the semiconductor layer 26, and the doped region 50 may define a lateral p-i-n diode that contributes to the functionality of the photodetector 14. The doped region 48, the intrinsic semiconductor materials of the semiconductor layer 28 and the portion of the pad 24 beneath the semiconductor layer 28, and the doped region 50 may define a lateral p-i-n diode that also contributes to the functionality of the photodetector 14.

A heavily-doped region 54 may be formed by a masked ion implantation in a portion of the doped region 46 adjacent to the side edge 32 of the pad 24 and a heavily-doped region 56 may be formed by the masked ion implantation in a portion of the doped region 48 adjacent to the side edge 33 of the pad 24. A heavily-doped region 58 may be formed by a masked ion implantation in the doped region 50 between the sidewall 39 of the semiconductor layer 26 and the sidewall 42 of the semiconductor layer 28. The heavily-doped regions 54, 56 may have the same conductivity type as the doped regions 46, 48 but at a higher dopant concentration. The heavily-doped region 58 may have the same conductivity type as the doped region 50 but at a higher dopant concentration.

Figure 5:
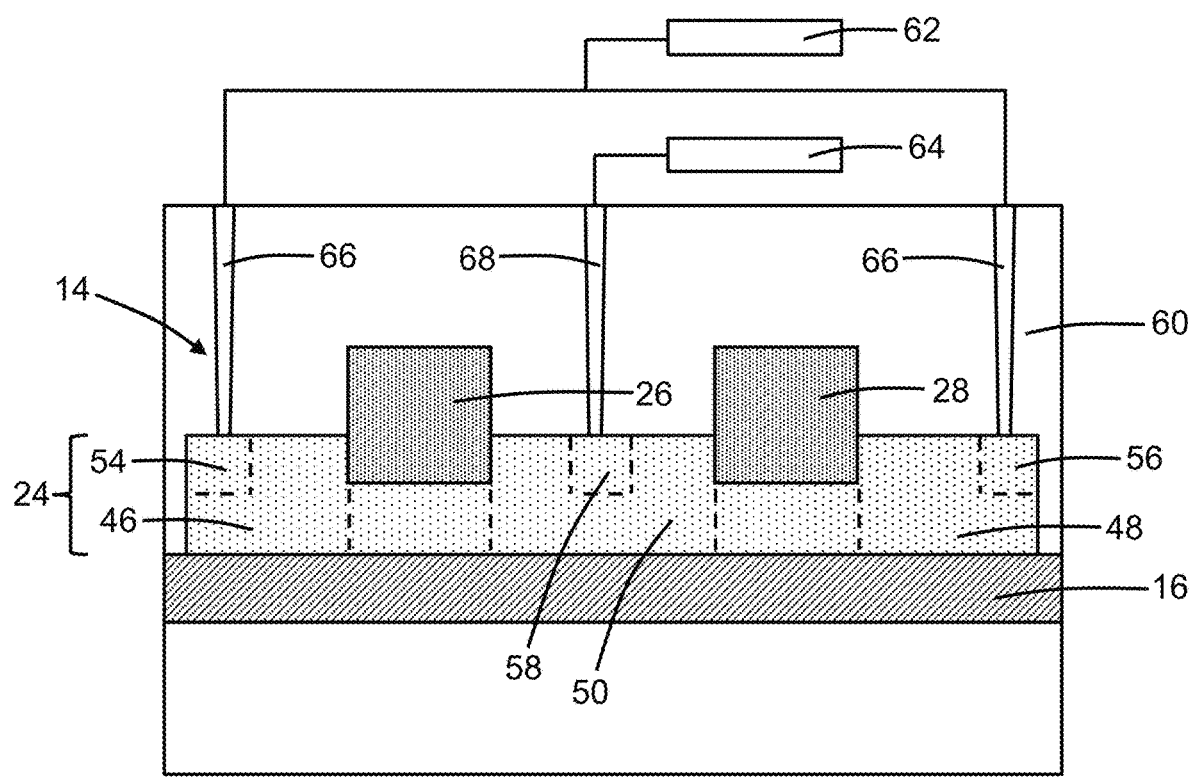
FIG. 5 is a cross-sectional view of the structure at a fabrication stage of the processing method subsequent to FIGS. 3, 4.

With reference to FIG. 5 in which like reference numerals refer to like features in FIGS. 3, 4 and at a subsequent fabrication stage, dielectric layers 60 may be formed over the waveguide cores 11, 12, 13, the photodetector 14, and the multimode interference coupler 15. In an embodiment, each dielectric layer 60 may be comprised of a dielectric material, such as silicon dioxide or silicon nitride.

Contacts 66 may be formed that penetrate fully through the dielectric layers 60 to land on the heavily-doped regions 54, 56. Contacts 68 may be formed that penetrate fully through the dielectric layers 60 to land on the heavily-doped region 58. The heavily-doped regions 54, 56 electrically couple the contacts 66 to the doped regions 46, 48. The heavily-doped region 58 electrically couples the contacts 68 to the doped region 50. The contacts 66, 68 may be comprised of a metal, such as tungsten. The doped regions 46, 48 and the doped region 50 may be biased through the contacts 66, 68, which may be coupled to interconnects (not shown) in dielectric layers formed over the dielectric layers 60.

The contacts 66 may be coupled to a terminal 62 and the contacts 68 may be coupled to a terminal 64. In an embodiment, the terminal 62 may represent the anode of the photodetector 14, the terminal 64 may represent the cathode of the photodetector 14, and the cathode is shared by the doped regions 46, 48. In an alternative embodiment, the terminal 62 may represent the cathode of the photodetector 14, the terminal 64 may represent the anode of the photodetector 14, and the anode is shared by the doped regions 46, 48.

In use, light, such as laser light, propagates in the waveguide core 11 to the multimode interference coupler 15, which splits the optical power of the light with a splitting ratio between the waveguide core 12 and the waveguide core 13. The waveguide core 12 guides one split portion of the optical power to the semiconductor layer 26. The waveguide core 13 guides the other split portion of the optical power to the semiconductor layer 28. In an embodiment, the light received by the photodetector 14 from the waveguide cores 12, 13 may be modulated as an optical signal. The semiconductor layers 26, 28 absorb photons of the light and convert the absorbed photons into charge carriers by photoelectric conversion. The biasing of the doped regions 46, 48 and the doped region 50 causes the charge carriers to be collected and output from the photodetector 14 to provide, as a function of time, a measurable photocurrent.

The divided and distributed delivery of optical power to the multiple semiconductor layers 26, 28 of the photodetector 14 may significantly improve performance metrics, such as the responsivity, the coupling efficiency, and the bandwidth, of the photodetector 14. The performance metrics of the photodetector 14 may be particularly improved for operation at high input optical powers because the light is divided and provided to multiple semiconductor layers 26, 28. The overall footprint and size of the photodetector 14 may be reduced while maintaining satisfactory performance metrics for operation at high input optical powers.

Figure 6:
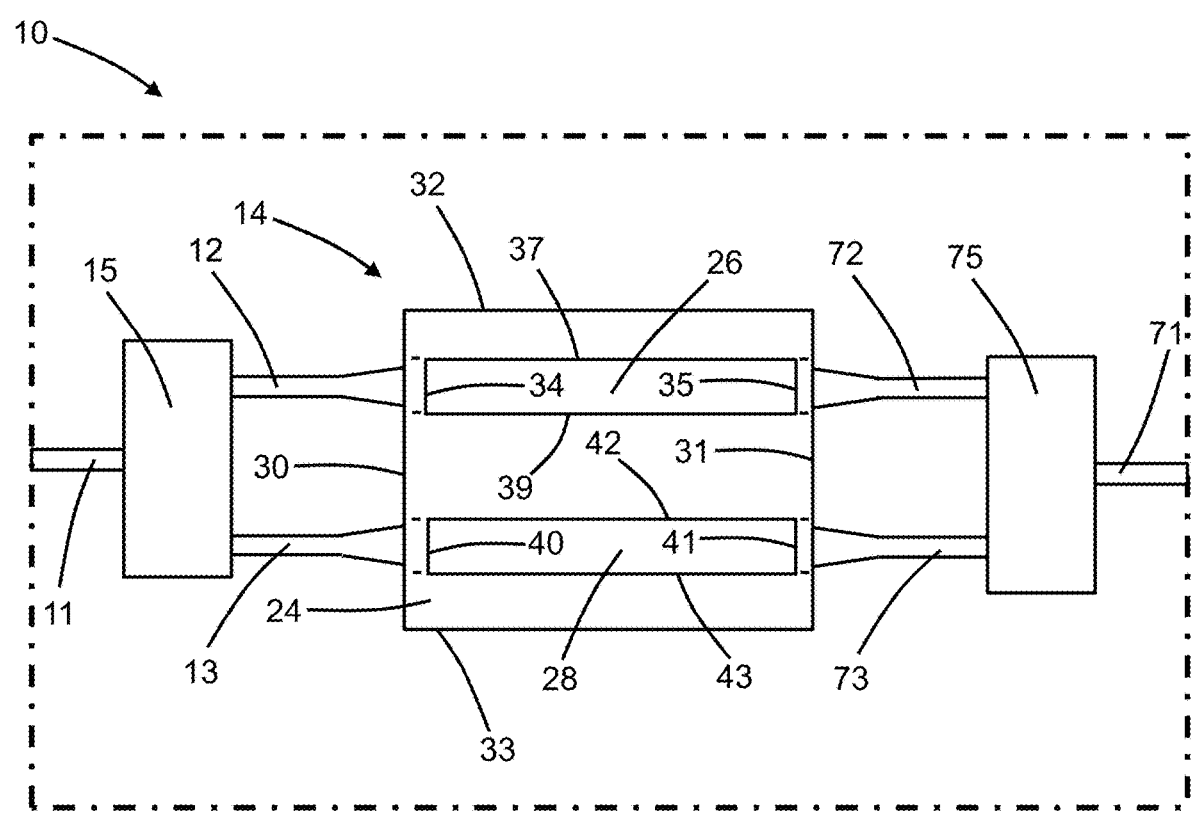
FIG. 6 is a top view of a structure in accordance with alternative embodiments of the invention.

With reference to FIG. 6 and in accordance with alternative embodiments, the structure 10 may further include a waveguide core 71, a waveguide core 72, a waveguide core 73, and a multimode interference coupler 75 that are positioned on, and above, the dielectric layer 16 and the semiconductor substrate 18. The waveguide core 71, the waveguide core 72, the waveguide core 73, and the multimode interference coupler 75 may be similar or identical to the waveguide core 11, the waveguide core 12, the waveguide core 13, and the multimode interference coupler 15.

The waveguide core 72 adjoins a portion of the side edge 31 of the pad 24 adjacent to the sidewall 35 of the semiconductor layer 26. The waveguide core 73 adjoins a portion of the side edge 31 of the pad 24 adjacent to the sidewall 41 of the semiconductor layer 28. In an embodiment, the waveguide core 72 and the waveguide core 73 may have tapered sections that adjoin the side edge 31 of the pad 24. The semiconductor layer 26 is longitudinally positioned between the waveguide core 12 and the waveguide core 72. The semiconductor layer 28 is longitudinally positioned between the waveguide core 13 and the waveguide core 73.

The addition of the waveguide cores 72, 73 expands the number of inputs to the photodetector 14, which may further improve performance metrices, such as the responsivity, the coupling efficiency, and/or the bandwidth, of the photodetector 14.

Figure 7:
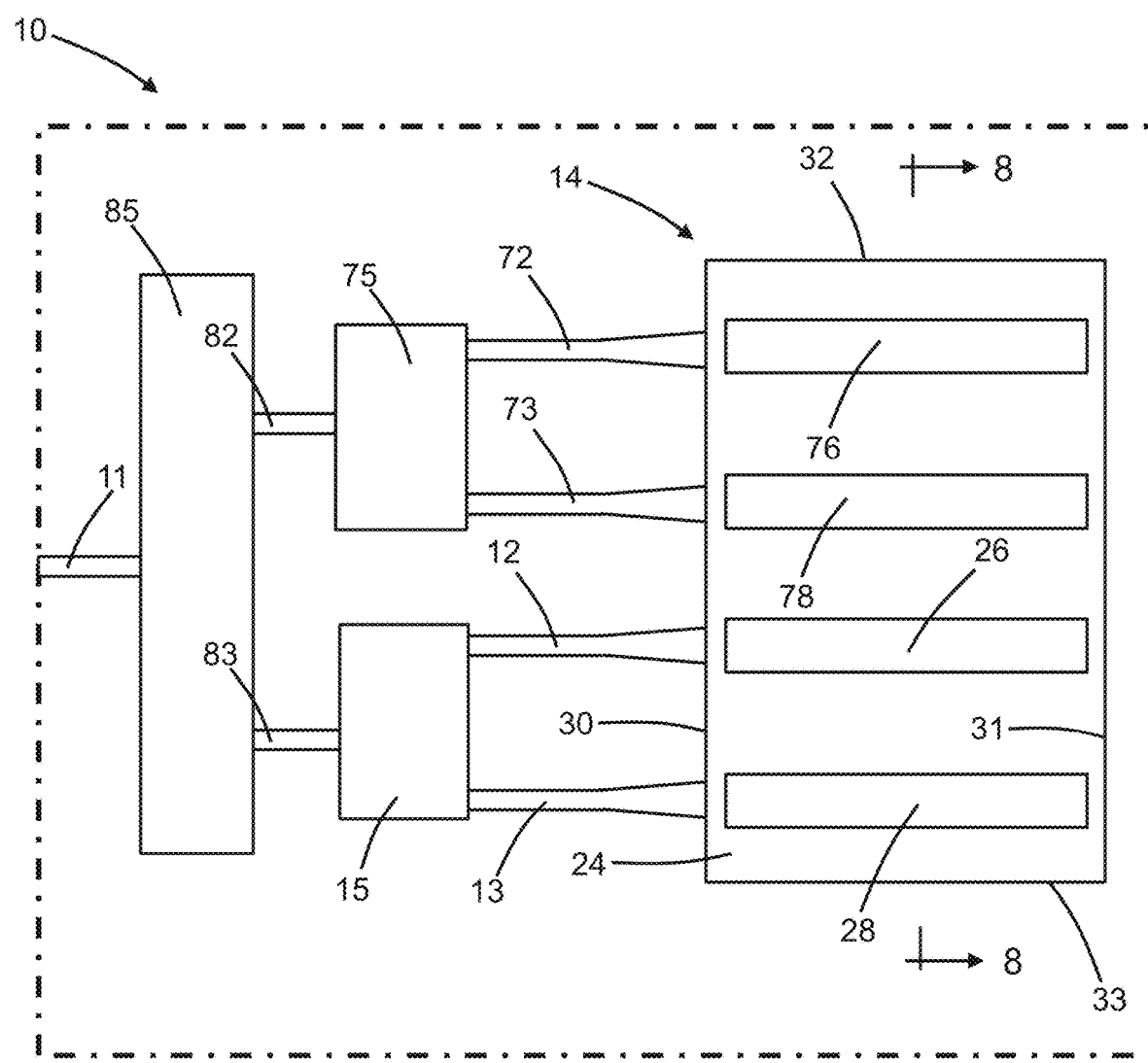
FIG. 7 is a top view of a structure in accordance with alternative embodiments of the invention.
Figure 8:
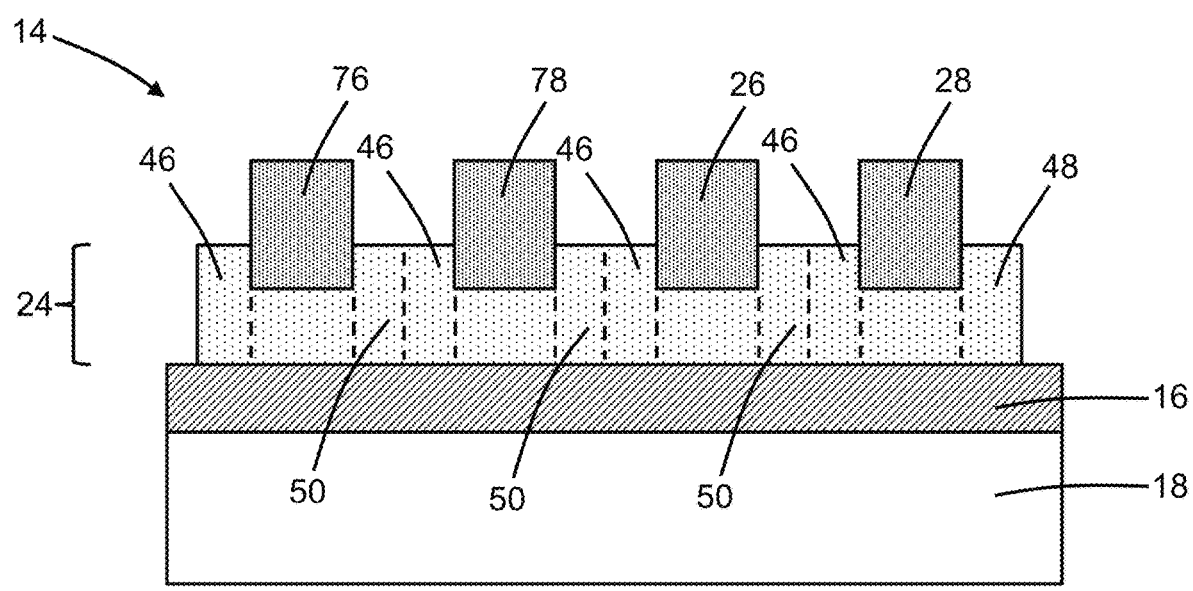
FIG. 8 is a cross-sectional view taken generally along line 8-8 in FIG. 7.

With reference to FIGS. 7, 8 and in accordance with alternative embodiments, the structure 10 may further include a semiconductor layer 76 and a semiconductor layer 78 that are formed on the pad 24, as well as a multimode interference coupler 85, a waveguide core 82 coupling an output of the multimode interference coupler 85 to an input of the multimode interference coupler 75, and a waveguide core 83 coupling another output of the multimode interference coupler 85 to an input of the multimode interference coupler 15. The semiconductor layers 76, 78 are disposed on the pad 24 adjacent to the semiconductor layers 26, 28 to provide a laterally-spaced array. The waveguide cores 12, 13 and the waveguide cores 72, 73 adjoin the same side edge 30 of the pad 24. The waveguide core 72 adjoins a portion of the side edge 30 of the pad 24 adjacent to a sidewall of the semiconductor layer 76. The waveguide core 73 adjoins a portion of the side edge 30 of the pad 24 adjacent to the sidewall 41 of the semiconductor layer 78. Doped region 46 and doped region 50 are formed in groups in the pad 24. Heavily-doped regions (not shown) are subsequently formed for use in establishing connections between the doped regions 46, 48 and the terminal 62 and between the doped regions 50 and the terminal 64.

The addition of the semiconductor layers 76, 78, and the utilization of the multimode interference couplers 15, 75, 85 expands the number of inputs to the photodetector 14, which may further improve performance metrices, such as the responsivity, the coupling efficiency, and/or the bandwidth, of the photodetector 14 by further distributing the optical power that is supplied to the photodetector 14.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value or precise condition as specified. In embodiments, language of approximation may indicate a range of +/−10% of the stated value(s) or the stated condition(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction in the frame of reference perpendicular to the horizontal plane, as just defined. The term "lateral" refers to a direction in the frame of reference within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present. Different features may "overlap" if a feature extends over, and covers a part of, another feature.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure for a photonic chip, the structure comprising:
    a photodetector including a pad, a first semiconductor layer on the pad, and a second semiconductor layer on the pad, the pad including a first doped region and a second doped region, the first doped region having a first conductivity type, the second doped region having a second conductivity type opposite from the first conductivity type, and the first doped region and the second doped region positioned in the pad between the first semiconductor layer and the second semiconductor layer;
    a first waveguide core connected to the pad adjacent to the first semiconductor layer; and
    a second waveguide core connected to the pad adjacent to the second semiconductor layer.

2. The structure of claim 1 wherein the pad includes a side edge, the first waveguide core is adjoined to a first portion of the side edge of the pad, and the second waveguide core is adjoined to a second portion of the side edge of the pad.

3. The structure of claim 2 further comprising:
    a first multimode interference coupler having a first output and a second output,
    wherein the first waveguide core extends from the first output to the first portion of the side edge of the pad, and the second waveguide core extends from the second output to the second portion of the side edge of the pad.

4. The structure of claim 1 wherein the first semiconductor layer and the second semiconductor layer comprise germanium.

5. The structure of claim 1 wherein the first semiconductor layer and the second semiconductor layer comprise a material configured to convert photons into charge carriers.

6. The structure of claim 1 wherein the first doped region are is coupled to an anode, and the second doped region is coupled to a cathode.

7. The structure of claim 1 wherein the first doped region is coupled to a cathode, and the second doped region is coupled to an anode.

8. The structure of claim 1 wherein the photodetector includes a third semiconductor layer on the pad, and further comprising:
    a third waveguide core connected to the pad adjacent to the third semiconductor layer.

9. The structure of claim 8 wherein the pad includes a side edge, the first waveguide core adjoins a first portion of the side edge of the pad, the second waveguide core adjoins a second portion of the side edge of the pad, and the third waveguide core adjoins a third portion of the side edge of the pad.

10. The structure of claim 1 wherein the first semiconductor layer and the second semiconductor layer are separated by a gap.

11. A method of forming a structure for a photonic chip, the method comprising:
    forming a photodetector including a pad, a first semiconductor layer on the pad, a second semiconductor layer on the pad, and a third semiconductor layer on the pad, wherein the pad includes a first doped region and a second doped region, the first doped region has a first conductivity type, the second doped region has a second conductivity type opposite from the first conductivity type, and the first doped region and the second doped region are positioned in the pad between the first semiconductor layer and the second semiconductor layer;

forming a first waveguide core connected to the pad adjacent to the first semiconductor layer; and forming a second waveguide core connected to the pad adjacent to the second semiconductor layer.

12. The structure of claim 3 wherein the photodetector includes a third semiconductor layer on the pad, and further comprising:

a third waveguide core connected to the pad adjacent to the third semiconductor layer.

13. The structure of claim 12 further comprising:

a second multimode interference coupler having an output, wherein the third waveguide core extends from the output of the second multimode interference coupler to a third portion of the side edge of the pad.

14. The structure of claim 8 wherein the pad includes a third doped region and a fourth doped region, the third doped region having the first conductivity type, the fourth doped region having the second conductivity type, and the third doped region and the fourth doped region positioned in the pad between the second semiconductor layer and the third semiconductor layer.

15. The structure of claim 14 wherein the first semiconductor layer and the second semiconductor layer are separated by a first gap, the first doped region and the second doped region are arranged in the first gap, the second semiconductor layer and the third semiconductor layer are separated by a second gap, and the third doped region and the fourth doped region are arranged in the second gap.

16. The structure of claim 15 wherein the first doped region and the third doped region are coupled to an anode, and the second doped region and the fourth doped region are coupled to a cathode.

17. The structure of claim 15 wherein the first doped region and the third doped region are coupled to a cathode, and the second doped region and the fourth doped region are coupled to an anode.

18. The structure of claim 8 wherein the first semiconductor layer, the second semiconductor layer, and the third semiconductor layer comprise germanium.

19. The structure of claim 8 wherein the first semiconductor layer, the second semiconductor layer, and the third semiconductor layer comprise a material configured to convert photons into charge carriers.

20. The structure of claim 1 wherein the first conductivity type is p-type, the second conductivity type is n-type, the pad includes a first portion beneath the first semiconductor layer, the pad includes a second portion beneath the second semiconductor layer, and the first portion and the second portion of the pad comprise intrinsic semiconductor material.

* * * * *